United States Patent
Saito et al.

(10) Patent No.: US 9,691,784 B2
(45) Date of Patent: Jun. 27, 2017

(54) SEMICONDUCTOR MEMORY DEVICE

(71) Applicant: KABUSHIKI KAISHA TOSHIBA, Tokyo (JP)

(72) Inventors: Shinji Saito, Yokohama Kanagawa (JP); Hiroyuki Maeda, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 73 days.

(21) Appl. No.: 14/634,710

(22) Filed: Feb. 27, 2015

(65) Prior Publication Data
US 2016/0071872 A1 Mar. 10, 2016

(30) Foreign Application Priority Data
Sep. 5, 2014 (JP) ................................ 2014-181627

(51) Int. Cl.
| | |
|---|---|
| H01L 29/49 | (2006.01) |
| H01L 27/11582 | (2017.01) |
| H01L 27/11556 | (2017.01) |
| H01L 27/11573 | (2017.01) |
| H01L 29/06 | (2006.01) |
| H01L 21/764 | (2006.01) |
| H01L 21/762 | (2006.01) |
| H01L 21/78 | (2006.01) |
| H01L 27/11519 | (2017.01) |
| H01L 27/11524 | (2017.01) |
| H01L 27/1157 | (2017.01) |
| H01L 23/00 | (2006.01) |

(52) U.S. Cl.
CPC ...... *H01L 27/11582* (2013.01); *H01L 21/764* (2013.01); *H01L 21/76224* (2013.01); *H01L 21/78* (2013.01); *H01L 23/562* (2013.01); *H01L 27/1157* (2013.01); *H01L 27/11519* (2013.01); *H01L 27/11524* (2013.01); *H01L 27/11556* (2013.01); *H01L 27/11573* (2013.01); *H01L 29/0649* (2013.01); *H01L 2924/0002* (2013.01)

(58) Field of Classification Search
CPC .. H01L 21/76224; H01L 21/764; H01L 21/78
See application file for complete search history.

(56) References Cited

U.S. PATENT DOCUMENTS

| | | | | |
|---|---|---|---|---|
| 8,680,653 | B2 * | 3/2014 | Miccoli | G03F 7/70625 257/48 |
| 9,343,322 | B2 * | 5/2016 | Chen | G11C 7/00 |
| 9,437,543 | B2 * | 9/2016 | Nakada | H01L 23/528 |
| 2011/0018051 | A1 * | 1/2011 | Kim | H01L 27/11575 257/324 |
| 2011/0057297 | A1 * | 3/2011 | Lee | H01L 23/562 257/620 |

(Continued)

FOREIGN PATENT DOCUMENTS

JP 2007-266143 A 10/2007

*Primary Examiner* — Michael Shingleton
(74) *Attorney, Agent, or Firm* — Patterson & Sheridan, LLP

(57) ABSTRACT

A semiconductor memory device includes a first portion including a semiconductor element, a second portion surrounding the semiconductor element. The second portion includes a stack of conductive layers and insulating layers, and at least one groove through the conductive layers and the insulating layers.

17 Claims, 6 Drawing Sheets

(56) References Cited

U.S. PATENT DOCUMENTS

| | | | |
|---|---|---|---|
| 2011/0254073 A1* | 10/2011 | Takekida | H01L 27/11521 257/316 |
| 2012/0313217 A1* | 12/2012 | Hung | H01L 23/585 257/532 |
| 2013/0043470 A1* | 2/2013 | Huang | H01L 23/562 257/48 |
| 2013/0062727 A1* | 3/2013 | Huang | H01L 23/3178 257/506 |
| 2015/0155296 A1* | 6/2015 | Yoon | H01L 27/11582 257/324 |
| 2015/0270333 A1* | 9/2015 | Yang | H01L 29/063 257/337 |
| 2016/0071872 A1* | 3/2016 | Saito | H01L 27/11582 257/314 |
| 2016/0071926 A1* | 3/2016 | Kitazaki | H01L 29/0649 257/314 |
| 2016/0111431 A1* | 4/2016 | Yoo | H01L 23/48 257/314 |
| 2016/0163583 A1* | 6/2016 | Liu | H01L 21/76229 257/401 |

* cited by examiner

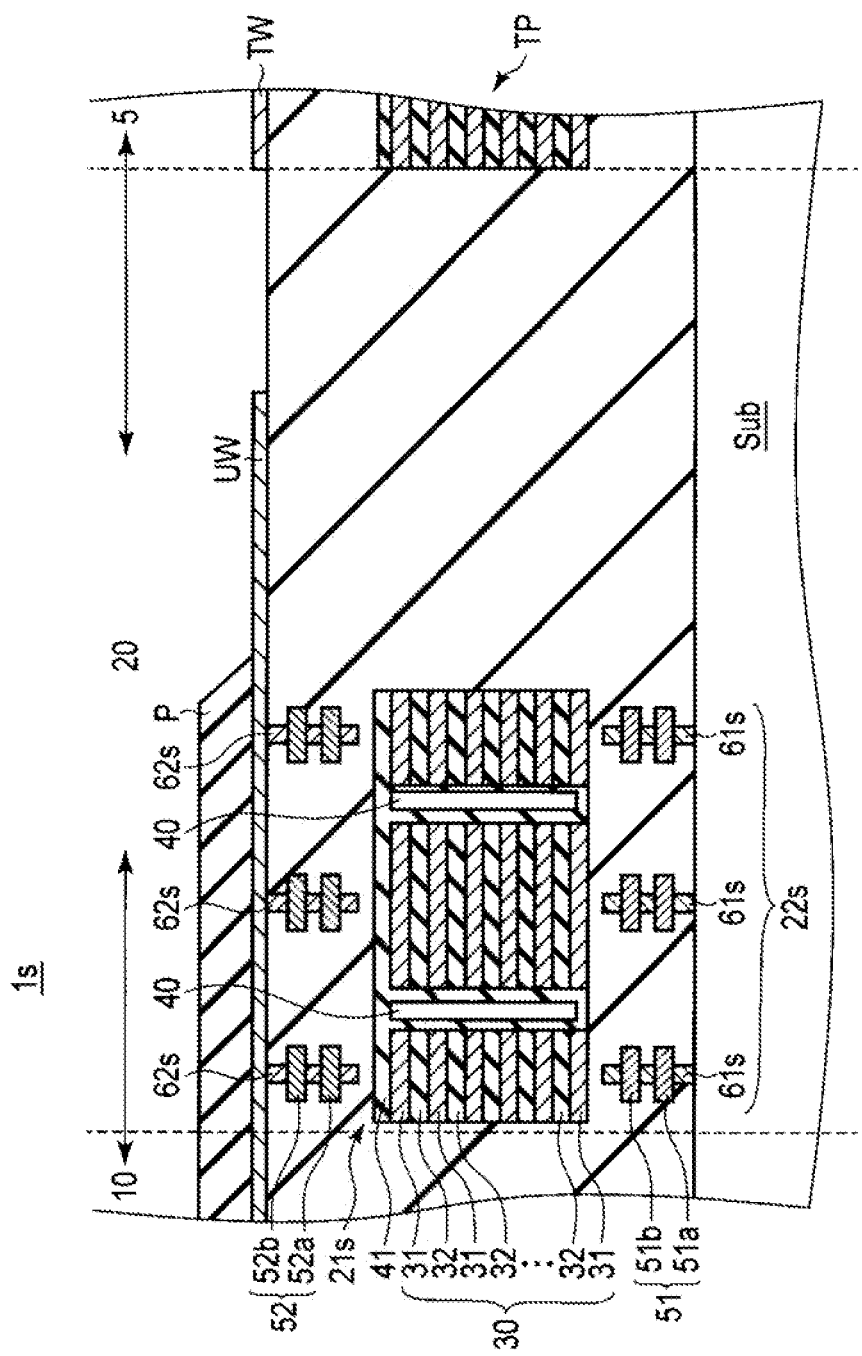

SEMICONDUCTOR MEMORY DEVICE

CROSS-REFERENCE TO RELATED APPLICATION

This application is based upon and claims the benefit of priority from Japanese Patent Application No. 2014-181627, filed Sep. 5, 2014, the entire contents of which are incorporated herein by reference.

FIELD

Embodiments described herein relate generally to a semiconductor memory device.

BACKGROUND

A NAND flash memory (hereinafter, also referred to as "BiCS memory") in which memory cells are three-dimensionally disposed is known.

DESCRIPTION OF THE DRAWINGS

FIG. 5 is a cross-sectional view illustrating first and second edge seals according to a second embodiment and the vicinity thereof.

DETAILED DESCRIPTION

Figure 1:
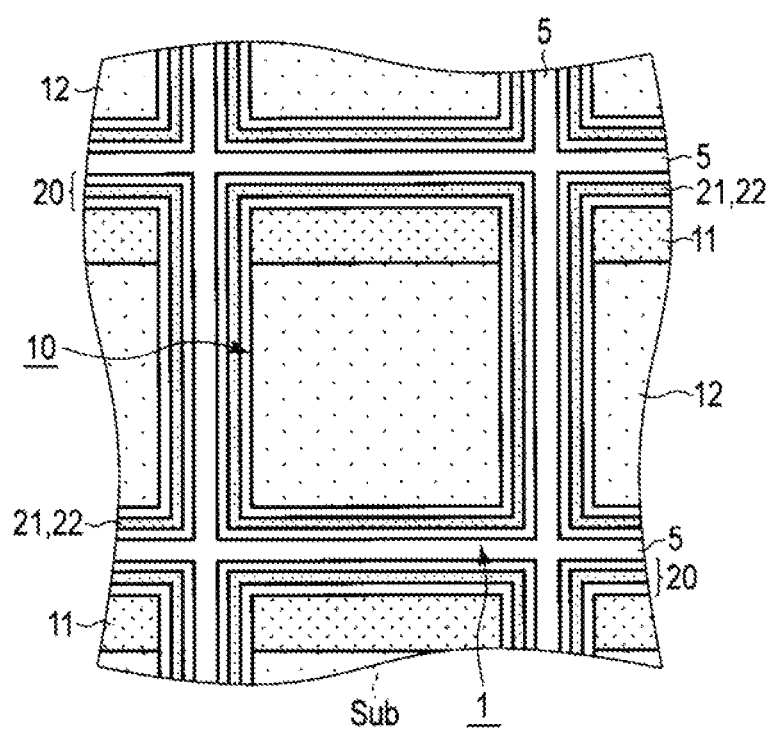
FIG. 1 is a layout diagram illustrating a part of a semiconductor memory device according to a first embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A semiconductor memory device having improved processing accuracy is provided.

In general, according to one embodiment, a semiconductor memory device includes a first portion including a semiconductor element, a second portion surrounding the semiconductor element. The second portion includes a stack of conductive layers and insulating layers, and at least one groove through the conductive layers and the insulating layers.

A BiCS memory includes a memory cell array. The memory cell array includes plural layers that are stacked above a semiconductor substrate. Each of the layers include plural memory cells. In a process of manufacturing the BiCS memory, the memory cell array is formed above the semiconductor substrate (wafer). Then, the semiconductor substrate is diced into individual chips.

However, in a structure in which memory cells are stacked in plural layers, when a physical impact is applied thereto by dicing, cracks may be initiated at, for example, an interface portion of the stacked structure. As a result, cracking or chipping may occur in the chips. Further, due to such cracking or chipping, water may infiltrate into the memory cell array.

A semiconductor memory device according to an embodiment described below includes: an element forming region; and an edge seal that is disposed outside the element forming region. The edge seal includes a stacked layers and a groove. The stacked layers includes a conductive layer and an insulating layer. The groove extends across the conductive layer and the insulating layer in the laminate.

The semiconductor memory device according to the embodiment will be described below with reference to the drawings. In the drawings, like numbers refer to like elements. In addition, the description will be repeated as necessary.

First Embodiment

A semiconductor memory device according to an embodiment will be described using FIGS. 1 to 3.

(1) Layout Example of BiCS Memory

A layout example of each element on a semiconductor substrate of the semiconductor memory device according to the embodiment will be described using FIG. 1. In FIG. 1 and the subsequent respective drawings, various configurations of the semiconductor memory device are described as being disposed on a top surface, which may be referred to as a first surface, of the semiconductor substrate.

As illustrated in FIG. 1, a BiCS memory (semiconductor memory device) 1 includes an element forming region 10 and an outer peripheral portion 20 that are disposed above a semiconductor substrate Sub. The BiCS memories 1 have, for example, a rectangular shape when viewed from the top, and are disposed in a matrix configuration. A dicing line (scribe line) 5 is disposed between the respective BiCS memories 1 of the semiconductor substrate Sub. The individual BiCS memories 1 are cut into chips by the semiconductor substrate Sub when a cut is made along the dicing line 5. In this disclosure, the BiCS memories 1 represent both a state of being disposed on the semiconductor substrate Sub before dicing; and a state of being cut into chips after dicing. The BiCS memories 1 may include the semiconductor substrate Sub before or after dicing.

The element forming region 10 has, for example, a rectangular shape when viewed from the top. The element forming region 10 includes a memory cell array 12 and a peripheral circuit 11. The memory cell array 12 includes plural memory cells. As described below, the memory cells are three-dimensionally disposed in a matrix configuration. The peripheral circuit 11 includes various drive circuits and the like described below. The outer peripheral portion 20 has, for example, a frame shape when viewed from the top, and surrounds the element forming region 10. The outer peripheral portion 20 includes edge seals (guard rings) 21 and 22, referred to as first and second edge seals. The edge seals 21 and 22 protects the element forming region 10 from physical impact during dicing.

(2) Configuration Example of Memory Cell Array

A configuration example of the memory cell array 12 of the BiCS memory 1 will be described using FIG. 2. In FIG. 2, an interlayer dielectric is not illustrated. In FIG. 2, a direction in which the respective layers are stacked is indicated as a stacking direction V.

Silicon Pillar and Electrode

Figure 2:
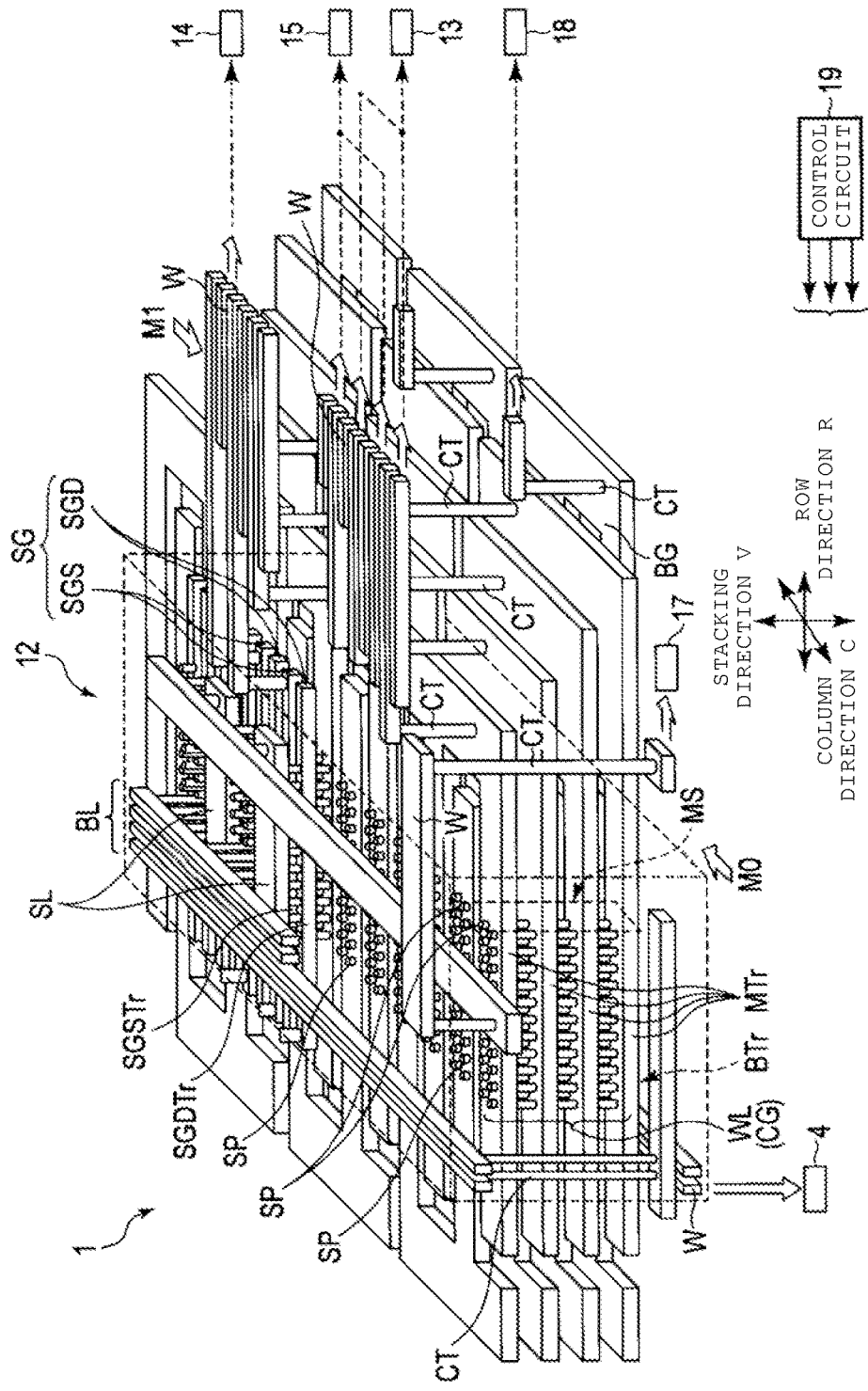
FIG. 2 is a perspective view illustrating a part of an element forming region according to the first embodiment.

As illustrated in FIG. 2, the BiCS memory 1 includes the memory cell array 12. The memory cell array 12 includes plural silicon pillars SP.

The plural silicon pillars SP are disposed in a matrix configuration above the semiconductor substrate Sub. The plural silicon pillars SP extend in the stacking direction V. A memory film (not illustrated) is provided on a side wall of the silicon pillar SP. A bottom portion of the silicon pillar SP reaches the inside of a back gate BG. Bottom portions of two silicon pillars SP which are adjacent to each other in a column direction C are coupled to each other in the back gate BG. The silicon pillars SP have a U-shape as a whole in the connected state.

Plural control gates CG (word lines WL) are disposed in the vicinity of the silicon pillars SP above the back gate BG. The memory cell array 12 includes plural layers, and control gates CG are disposed in the plural layers. In FIG. 2, the control gates CG disposed in four layers is illustrated but is not limited to this example. In each of the layers, for example, plural control gates CG are provided, and each of the control gates CG extends in a row direction R.

Above the control gate CG disposed on the uppermost layer, plural selection gates SG are disposed in the vicinity of an upper end portion of the silicon pillar SP. Each of the selection gates SG extends in the row direction R. The selection gate SG includes a source-side selection gate SGS and a drain-side selection gate SGD.

The back gate BG, the control gate CG, and the selection gate SG include, for example, polysilicon. Interlayer dielectrics (not illustrated) are disposed between the respective gates BG, CG, and SG. The interlayer dielectric includes, for example, silicon oxide. As described above, for example, the silicon oxide and the polysilicon are alternately disposed in the stacking direction V. Such a structure is called, for example, an OPOP (oxide-polysilicon-oxide-polysilicon) stacked structure.

Various Transistors

A memory cell transistor MTr, also referred to as the memory cell, includes a portion of the memory film surrounding the silicon pillar SP and the corresponding control gate CG. The memory cell transistor MTr may hold electric charge in at least a part of the memory film. The silicon pillar SP functions as a channel and a source/drain diffusion layer of the memory cell transistor MTr.

A source-side selection gate transistor SGSTr includes a portion of the memory film surrounding the silicon pillar SP and the corresponding source-side selection gate SGS. A drain-side selection gate transistor SGDTr includes a portion of the memory film surrounding the silicon pillar SP and the corresponding drain-side selection gate SGD. A back gate transistor BTr includes a coupling portion of the silicon pillars SP; a memory film in the vicinity of the coupling portion; and the back gate BG.

With the above-described configuration, current paths of the plural memory cell transistors MTr and the back gate transistor BTr are connected in series between the source-side selection gate transistor SGSTr and the drain-side selection gate transistor SGDTr. A memory string MS includes these transistors MTr, SGSTr, SGDTr, and BTr.

Wiring Structure

End portions of the word lines WL in the row direction disposed in plural layers have a stepwise shape as a whole.

The word line WL is connected to a word line drive circuit 13 through a wiring W and a contact CT.

The back gate BG, the source-side selection gate SGS, and the drain-side selection gate SGD are connected to a back gate drive circuit 18, a source-side selection gate line drive circuit 14, and a drain-side selection gate line drive circuit 15, respectively, through the wiring W and the contact CT.

Above the source-side selection gate SGS, plural source lines SL extend in the row direction R. Each of the source lines SL is connected to an end of the memory string MS through the contact CT. The source line SL is connected to a source line drive circuit 17 through the wiring W and the contact CT.

Above the drain-side selection gate SGD, plural bit lines BL are disposed above the source line SL. Each of the bit lines BL extends in the column direction C. Each of the bit lines BL is connected to the other end of the memory string MS through the contact CT. The bit line BL is connected to a sense amplifier 4 through the wiring W and the contact CT.

The word line drive circuit 13, the back gate drive circuit 18, the source-side selection gate line drive circuit 14, the drain-side selection gate line drive circuit 15, and the source line drive circuit 17 are disposed in a region outside the memory cell array 12 and are connected to a control circuit 19. The circuits 13-15 and 17-19 are in the above-described peripheral circuit 11.

In FIG. 2, each of the wirings W connected to the drive circuits 13-15 and 17-19 is disposed in one of multiple wiring layers having the same stacking level (for example, a wiring layer M1). The wiring layers M1, M2, . . . , and the like are positioned at stacking levels above the memory cell array 12. "Stacking level" refers to a height position (position in the stacking direction V) from the semiconductor substrate Sub such as a stacked film. The stacking level of each of the wiring layers M1, M2, . . . , and the like is also referred to as a wiring layer level. For example, a wiring layer M0 level is at a stacking level below the memory cell array 12. More specifically, the wiring layer M0 level is at a stacking level below the control gate CG of the lowermost layer.

(3) Configuration Example of Edge Seal

A configuration example of the edge seals 21 and 22 of the BiCS memory 1 will be described using FIG. 3.

Figure 3:
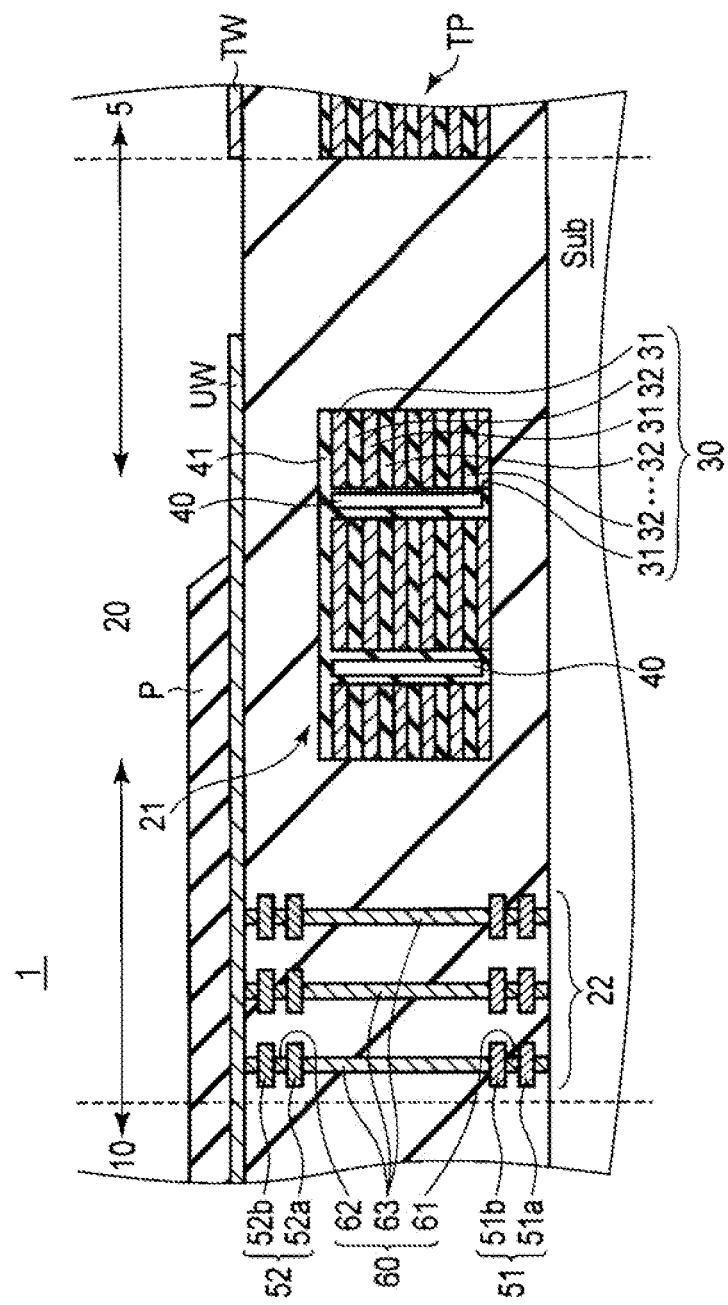
FIG. 3 is a cross-sectional view illustrating first and second edge seals according to the first embodiment and the vicinity thereof.

As illustrated in FIG. 3, the edge seals 21 and 22 are disposed on the outer peripheral portion 20 of the BiCS memory 1. The edge seal 22 is disposed outside the element forming region 10, and the edge seal 21 is disposed outside the edge seal 22. The dicing line 5 is disposed outside the edge seal 21 and outside the BiCS memory 1.

The edge seal 21 includes stacked layers 30. The stacked layers 30 include plural conductive layers 31 and plural insulating layers 32. The conductive layers 31 and the insulating layers 32 are alternately disposed in the stacking direction V. The conductive layer 31 includes, for example, polysilicon. The insulating layer 32 includes, for example, silicon oxide. As described above, the stacked layers 30 have an OPOP stacked structure. For example, the stacked layers 30 are stacked at the same stacking level as that of the memory cell array 12. The stacked layers 30 have, for example, a frame shape when viewed from the top, and surround the element forming region 10. However, a disconnected portion may be present in a part of the stacked layers 30.

The edge seal 21 includes a groove 40 that is disposed inside the stacked layers 30. The groove 40 extends through the stacked layers 30 in a direction intersecting the top surface of the semiconductor substrate Sub. The direction matches with, for example, the stacking direction (stacking direction V) of the stacked layers 30. The groove 40 extends through at least the plural conductive layers 31 and the plural insulating layer 32. Alternatively, the groove 40 may extend above the uppermost layer of the stacked layers 30, or may extend below the lowermost layer of the stacked layers 30. An insulating film 41 is disposed above the stacked layers 30. The insulating film 41 covers the groove 40. At least a part of the inside of the groove 40 is hollow. In this case, the insulating film 41 may cover at least a part of the sides and the bottom of the groove 40. The structure in which the groove 40 is hollow is called, for example, an air-gap structure. The groove 40 has, for example, a frame shape when viewed from the top, and surrounds the element forming region 10. However, a disconnected portion may be present in a part of the groove 40 such that a plurality of grooves 40 are disposed inside the stacked layers 30.

The edge seal 22 includes metal layers 51 and 52. The metal layer 51 is disposed, for example, at the wiring layer M0 level below a stacking level of the stacked layers 30. For convenience of description, the wiring layer M0 level is used referred to one or more wiring layer levels below the stacking level of the stacked layers 30. In FIG. 3, an example in which two layers (51a, 51b) of the metal layer 51 are positioned adjacent to each other in the stacking direction V is illustrated. However, the metal layer 51 may include one layer or two or more layers. In addition, as illustrated in FIG. 3, plural layers of the metal layer 51 may be disposed at the same wiring layer level. In addition, one or more layers of the metal layer 52 are disposed at the wiring layer levels M1, M2, etc. above the stacking level of the stacked layers 30. That is, one or more layers of the metal layer 52, for example, two layers (52a, 52b) are disposed adjacent to each other in the stacking direction V. In addition, plural layers of the metal layer 52 may be disposed at the same wiring layer level. The metal layers 51 and 52 have, for example, a frame shape when viewed from the top, and surround the element forming region 10. When the plural layers of the metal layer 51 and the metal layer 52 are disposed at the same wiring layer level, the metal layers 51 and 52 surround the element forming region 10 multiple times (for example, in FIG. 3, three times). However, a disconnected portion may be present in a part of the metal layers 51 and 52. In addition, the edge seal 22 may include only one of the metal layers 51 or 52.

The edge seal 22 also includes a metal pillar 60. The metal pillar 60 includes, for example, a conductive material. The metal pillar 60 extends, for example, in a direction intersecting the top surface of the semiconductor substrate Sub, that is, in the stacking direction V. The metal pillar 60 includes, for example, portions 61 to 63. The portion 61 is disposed between the metal layer 51a and the metal layer 51b. The portion 63 is disposed between the metal layer 51b and the metal layer 52a. The portion 62 is disposed between the metal layer 52a and the metal layer 52b. Alternatively, the portion 61 may include a portion below the metal layer 51a, and the portion 62 may include a portion above the metal layer 52b. For example, the metal pillar 60 is disposed at plural points along the frame-shaped metal layers 51 and 52.

The edge seals 21 and 22 are also referred to as guard rings, seal rings, or crack stoppers.

In the drawing, an upper layer wiring UW and a passivation film P are disposed above the metal layer 52 and on the top surface side of the BiCS memory 1. The passivation film P includes, for example, polyimide (PI) and protects the top surface of the BiCS memory 1. In the drawing, a test pattern TP and a test wiring TW are disposed in the dicing line 5. The test pattern TP and the test wiring TW are used, for example, when electrical characteristics and the like of the BiCS memory 1 are tested.

(4) Method of Manufacturing BiCS Memory

A method of manufacturing the semiconductor memory device according to the embodiment will be described with reference to FIGS. 2 and 3. According to the embodiment, the edge seal 21 is formed during a process of forming the memory cell array 12. The edge seal 22 is formed during a process of forming the contact CT and the wiring W in the vicinity of the memory cell array 12.

Process of Forming Stacked Layers

The stacked layers 30 of the edge seal 21 is formed during a process of forming various layers including: gates BG, CG, and SG of the memory cell array 12; and the interlayer dielectrics disposed therebetween.

In at least a part or all of the stacking processes, a layer corresponding to the conductive layer 31 is formed in the outer peripheral portion 20 during a step of forming a conductive layer in the element forming region 10. During a step of forming an insulating layer in the element forming region 10, a layer corresponding to the insulating layer 32 is formed in the outer peripheral portion 20. As a result, a structure corresponding to the stacked layers 30 is formed in the outer peripheral portion 20. The layer corresponding to the conductive layer 31 refers to the conductive layer 31 formed in the outer peripheral portion 20 after a groove forming process which is described later. The layer corresponding to the insulating layer 32 refers to the insulating layer 32 formed in the outer peripheral portion 20 after a groove forming process which is described later. The structure corresponding to the stacked layers 30 refers to the structure of the stacked layers 30 after the subsequent processes.

As a result, the structure corresponding to the stacked layers 30 includes layers having the same configurations as a part or all of the configurations of the control gate CG and the interlayer dielectric. Alternatively, in addition to the layer corresponding to the control gate CG, the structure corresponding to the stacked layers 30 may further include layers having the same configurations as those of the gates BG and SG and the interlayer dielectric.

Next, the layers corresponding to the various gates CG and SG and the interlayer dielectric are patterned by photolithography and etching. The patterning includes at least forming shapes of end portions of the various gates CG and SG in the row direction. The patterning may further include processing the structure corresponding to the stacked layers 30 of the outer peripheral portion 20 into a shape surrounding the element forming region 10. Gaps formed by patterning, for example, the peripheral edges of the layers corresponding to the various gates CG and SG and the interlayer dielectric and the structure corresponding to the stacked layers 30 are filled with the insulating film and the like.

Groove Forming Process

The groove 40 of the edge seal 21 is formed during a process of isolating the above-described various transistors MTr, SGSTr, and SGDTr from each other in the respective layers. In the isolation process, various layers, which form the various gates CG and SG and the interlayer dielectrics disposed therebetween, are patterned by, for example, photolithography and etching, and a groove is formed in these respective layers.

In the above-described isolation process, the groove 40 is formed in the structure corresponding to the stacked layers 30 of the outer peripheral portion 20 by, for example, photolithography and etching. The groove 40 has a length corresponding to that of the groove which is formed in the element forming region 10 in the stacking direction V.

More specifically, the groove 40 may be formed so as to extend through at least plural layers in the stacked layers 30. Alternatively, the groove 40 may be formed so as to extend through the entire range from the uppermost layer to the lowermost layer in the stacked layers 30. Further, the groove 40 may be formed so as to extend above the top surface of the stacked layers 30 or so as to extend below the bottom surface of the stacked layers 30.

Next, a process of filling the groove with an insulating material in the element forming region 10 is performed. Concurrently with this filling process, a process of covering the opening of the groove 40 with the insulating film 41 in the outer peripheral portion 20 is performed. As a result, at least a part of the inside of the groove 40 is maintained to be hollow.

When the insulating film 41 is formed, there are several methods of maintaining the inside of the groove 40 to be hollow. For example, the width of the groove 40 may be made sufficiently narrow so that the inside of the groove 40 is not filled with the insulating film 41. In addition, for example, the insulating film 41 may be formed under formation conditions which are adjusted to obtain a step coverage in which the inside of the groove 40 is not filled with the insulating film 41. As a result, the inside of the groove 40 is hollow, that is, has an air gap. However, the insulating film 41 may be formed in a part of the inside of the groove 40.

Alternatively, the film for covering the opening of the groove 40 may be formed not in the filling process but in a process of forming another film. This film forming process is not particularly limited to any particular one so long as the process is performed after the process of forming the groove 40. In this case, in addition to the insulating film, the film for covering the opening of the groove 40 may be a conductive film or another film.

As described above, the edge seal 21 is formed, for example, in the process of forming the memory cell array 12 but is a dummy region that has no electrical functions.

Process of Forming Metal Layer and Metal Pillar

The metal layers 51 and 52 and the metal pillar 60 of the edge seal 22 are formed during the process of forming the wiring W and the contact CT in the vicinity of the memory cell array 12.

That is, the metal layer 51 is formed in the element forming region 10 during a process of forming the wiring W in the wiring layer M0. The portion 61 of the metal pillar 60 is formed in the element forming region 10 during a process of forming the contact CT that connects the plural wirings W positioned at different levels in the wiring layer M0.

The portion 63 of the metal pillar 60 is formed in the element forming region 10 during a process of forming the contact CT that connects the wiring layer M0 level and the wiring layer M1 level.

That is, the metal layer 52 is formed in the element forming region 10 during a process of forming the wiring W in the wiring layers M1, M2, . . . , and the like. The portion 62 of the metal pillar 60 is formed in the element forming region 10 during a process of forming the contact CT that connects the plural wirings W positioned at different levels in the wiring layers M1, M2, . . . , and the like.

As a result, the metal layers 51 and 52 surrounding the element forming region 10 are formed. In addition, the metal pillar 60 is disposed at plural points along the metal layers 51 and 52.

As described above, the edge seal 22 is formed, for example, during the process of forming the contact CT and the wiring W in the vicinity of the memory cell array 12 but is a dummy region that has no electrical functions.

(5) Effect According to Embodiment

According to the embodiment, one or plural effects described below may be exhibited.

(A) According to the embodiment, the edge seal 21 includes the stacked layers 30 that includes the conductive layer 31 and the insulating layer 32. As a result, the memory cell array 12 may be protected from a physical impact from dicing.

For example, a planar NAND memory will be described as a comparative example. In the planar NAND memory, memory cells are two-dimensionally disposed in a memory cell array. For example, the memory cells are disposed in a planar manner along a top surface of a semiconductor substrate. The planar NAND memory includes, for example, an edge seal including a metal layer and a metal pillar in an outer peripheral portion thereof.

However, in a three-dimensional NAND memory in which memory cells are three-dimensionally disposed, the thickness thereof in a stacking direction increases. In addition, cracks are likely to be initiated at an interface portion of the stacked structure. Therefore, even when the edge seal including the metal layer and the metal pillar is applied to the three-dimensional NAND memory, a sufficient protection may not be obtained.

According to the embodiment, the BiCS memory 1 includes the edge seal 21 including the stacked layers 30. As a result, the protection provided by the outer peripheral portion 20 of the BiCS memory 1 increases. Accordingly, physical damages of the BiCS memory 1 such as cracking, chipping, film peeling caused by a physical impact during dicing may be suppressed. In addition, the dicing is typically performed while causing a liquid such as water to flow on the semiconductor substrate Sub. According to the embodiment, infiltration of water from damaged portions to the memory cell array 12 may be suppressed.

(B) According to the embodiment, the edge seal 21 includes the groove 40 that extends through the conductive layer 31 and the insulating layer 32 in the stacked layers 30. As a result, the cracking and chipping of the BiCS memory 1 caused by dicing may be further suppressed. For example, even when cracks propagate along the semiconductor substrate Sub at a portion outside of the edge seal 21, for example, at an end portion of the BiCS memory 1, the propagation of the cracks to the inside of the BiCS memory 1 beyond the groove 40 may be suppressed. In this way, the groove 40 functions as a stopper which stops cracking or chipping caused by dicing outside the outer peripheral portion 20. By increasing the number of the grooves 40, this stopper function is further enhanced.

(C) According to the embodiment, the edge seal 21 is formed during a process of forming the memory cell array 12. As a result, the process of forming the edge seal 21 may be easily incorporated into the process of forming the memory cell array 12. The edge seal 21 and the memory cell array 12 may be collectively formed in the same process, and it is not necessary to increase the number of processes. Accordingly, the complication of the manufacturing process and an increase in the manufacturing cost may be suppressed.

(6) Modification Example According to Embodiment

In the above-described embodiment, the first and second edge seals have a frame shape surrounding the element forming region 10. On the other hand, in a modification of the first embodiment, the first and second edge seals are disposed at only a part of the outer peripheral portion 20.

Figure 4A:
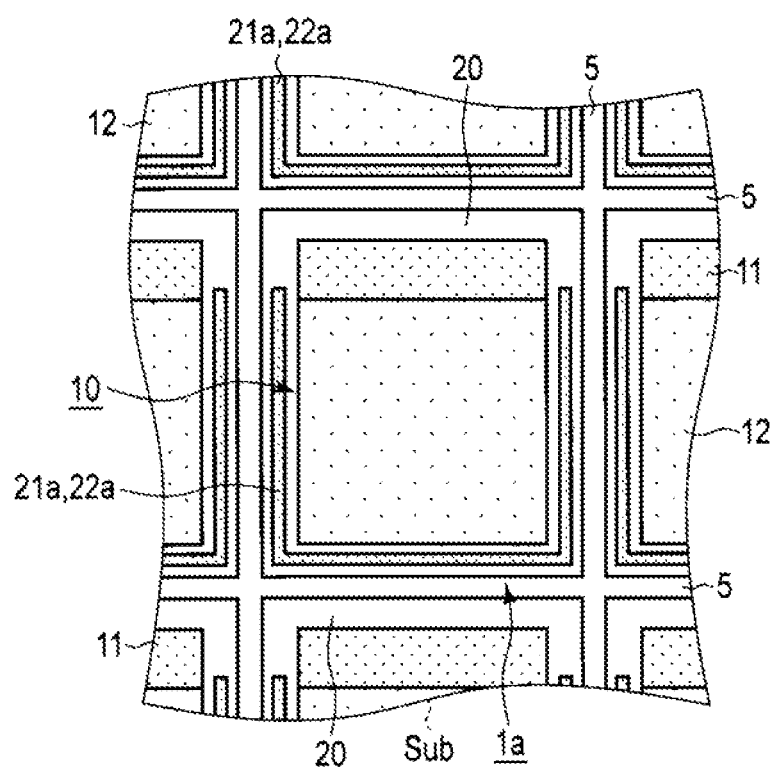
FIGS. 4A and 4B are layout diagrams illustrating a part of a semiconductor memory device according to a modification example of the first embodiment.

In Modification Example 1 of FIG. 4A, edge seals 21a and 22a, which are the first and second edge seals, are disposed on the outer peripheral portion 20 on a side where the memory cell array 12 is disposed. In the element forming region 10, for example, three sides of the memory cell array 12 are adjacent to the outer peripheral portion 20. The edge seal 21a is disposed, for example, at three sides of the outer peripheral portion 20 which are adjacent to the memory cell array 12, and is not disposed on the outer peripheral portion 20 on the peripheral circuit 11 side.

According to Modification Example 1, the edge seals 21a and 22a are not disposed on the peripheral circuit 11 side, and thus the area may be reduced correspondingly. Accordingly, the chip area of a BiCS memory 1a may be reduced while protecting the more important region of element forming region 10, i.e., the region of the memory cell array 12.

Figure 4B:
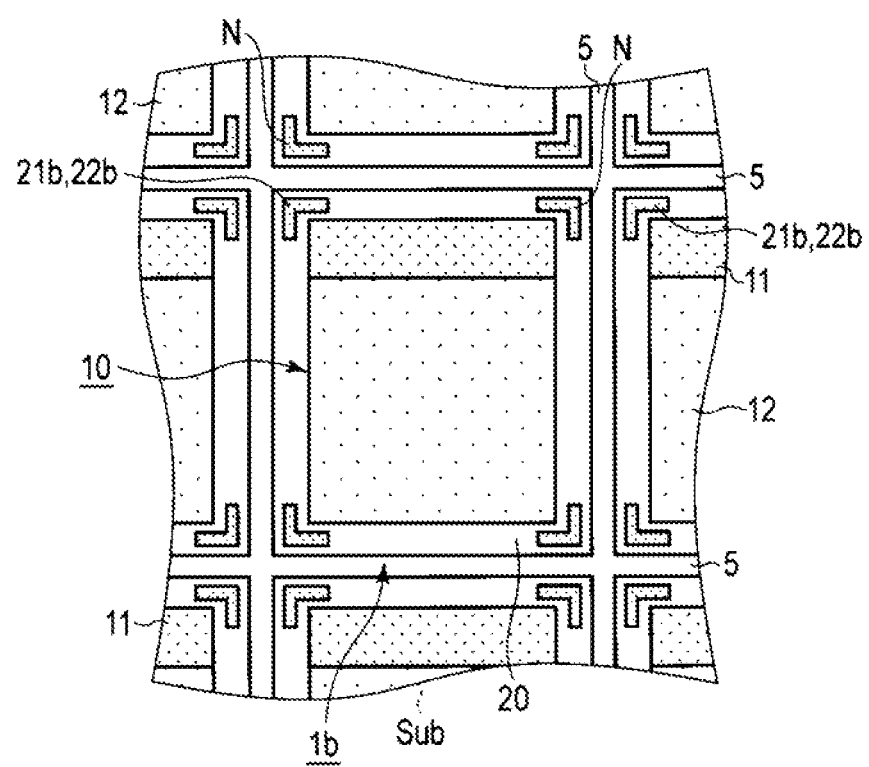

In Modification Example 2 of FIG. 4B, edge seals 21b and 22b, which are the first and second edge seals, are disposed at an intersection point N of the outer peripheral portion 20. The outer peripheral portion 20 is disposed, for example, in a rectangular shape, and four sides thereof intersect each other at four intersection points N so as to close and surround the element forming region 10. The edge seals 21b and 22b are disposed, for example, in an L-shape including the intersection points N.

The intersection point N of the outer peripheral portion 20 is positioned in the vicinity of an intersection of the dicing line 5. As a result, the intersection portion of the dicing line 5 is diced multiple times in different directions. Accordingly, this portion is likely to be affected by a physical impact during dicing, and chipping or cracking is likely to occur in this portion.

According to Modification Example 2, the protection provided by the portion in the vicinity of the intersection point N where chipping is likely to occur may be enhanced. In addition, since the edge seals 21b and 22b are not disposed in other portions, the chip area of a BiCS memory 1b may be reduced correspondingly.

Second Embodiment

A semiconductor memory device according to an embodiment will be described using FIG. 5.

A BiCS memory 1s which is the semiconductor memory device according to the second embodiment is different from that according to the first embodiment, in that the first edge seal is disposed to be enclosed in the second edge seal.

As illustrated in FIG. 5, an edge seal 22s which is the second edge seal includes the metal layers 51 and 52 and metal pillars 61s and 62s. The metal pillar 61s is disposed in the vicinity of the metal layer 51. The metal pillar 62s is disposed in the vicinity of the metal layer 52. That is, the edge seal 22s is divided into the metal layer 51 and the metal pillar 61s and the metal layer 52 and the metal pillar 62s, and is disposed on the outer peripheral portion 20.

More specifically, the metal pillar 61s extends from the metal layer 51a to the metal layer 51b. Alternatively, the metal pillar 61s may include a portion below the metal layer 51a, or may include a portion above the metal layer 51b. The metal pillar 62s extends from the metal layer 52a to the metal layer 52b. Alternatively, the metal pillar 62s may include a portion below the metal layer 52a, or may include a portion above the metal layer 52b.

The edge seal 21s which is the first edge seal is disposed between the second edge seal part including the metal layer 51 and the metal pillar 61s; and the second edge seal part including the metal layer 52 and the metal pillar 62s. The edge seal 21s includes the stacked layers 30 that includes the conductive layer 31 and the insulating layer 32; and the groove 40 that extends in the stacking direction V.

In this case, the edge seal 21s is disposed to be enclosed in a gap between the second edge seal part including the metal layer 51 and the metal pillar 61s of the edge seal 22s; and the second edge seal part including the metal layer 52 and the metal pillar 62s of the edge seal 22s. That is, the edge seal 21s is disposed to be vertically interposed between the second edge seal part including the metal layer 51 and the metal pillar 61s of the edge seal 22s; and the second edge seal part including the metal layer 52 and the metal pillar 62s of the edge seal 22s.

According to the second embodiment, the following effects are exhibited in addition to the effects of the above-described first embodiment.

According to the embodiment, the edge seal 21s is enclosed in the edge seal 22s, and thus the area occupied by the edge seals 21s and 22s may be reduced. Accordingly, the area of the outer peripheral portion 20 may be reduced. Accordingly, the chip area of the BiCS memory is may be reduced.

Other Embodiments

Hereinabove, the respective embodiments and the modification examples thereof are described. However, these embodiments and the modification examples are presented as examples. The technical ideas of these embodiments and the modification examples do not limit the material, shape, structure, disposition, and the like of the components. These new embodiments and the modification examples may be implemented in other various forms, and in the implementation step, various deletions, substitutions, and modifications may be made within a range not departing from the scope of the embodiments and the modification examples. Further, the above-described embodiments and the modification examples include various steps, and various embodiments may be conceived by appropriately combining the plural structural elements disclosed herein.

In the description of the above-described embodiments and the modification examples, the outer peripheral portion 20 includes not only the first edge seal but also the second edge seal, but the embodiments and the modification examples are not limited thereto. The outer peripheral portion does not necessarily include the second edge seal. In addition, for example, a configuration may be adopted in which the first and second edge seals are disposed on the memory cell array side and the side of the outer peripheral portion including the intersection point, and only one of the first and second edge seals is disposed in the other regions.

In the description of the above-described embodiments and the modification examples, the first edge seal includes the stacked layers and the groove, but the embodiments and the modification examples are not limited thereto. The first edge seal may include only one of the stacked layers and the groove. In addition, for example, a configuration may be adopted in which the stacked layers and the groove are disposed on the memory cell array side and the side of the outer peripheral portion including the intersection point, and only one of the stacked layers and the groove is disposed on the other regions.

In the description of the above-described embodiments, the memory string MS has a U-shape in which a pair of the silicon pillars SP are coupled to each other, but the embodiments are not limited thereto. For example, the memory string may have an I-shape not including the coupling portion.

In addition, the configuration of the memory cell array is described in, for example, U.S.-A-2009/0,267,128 (U.S. patent application Ser. No. 12/407,403) "Three dimensional stacked nonvolatile semiconductor memory". In addition, the configuration of the memory cell array is described in U.S.-A-2009/0,268,522 (U.S. patent application Ser. No. 12/406,524) "Three dimensional stacked nonvolatile semiconductor memory", U.S.-A-2010/0,207,195 (U.S. patent application Ser. No. 12/679,991) "Non-volatile semiconductor storage device and method of manufacturing the same", and U.S.-A-2011/0,284,946 (U.S. patent application Ser. No. 12/532,030) "Semiconductor memory and method for manufacturing same". The entire contents of these patent applications are incorporated herein by reference.

In the above-described embodiments and the modification examples, a memory system of the memory cell may be any one of a binary memory system or a multi-valued memory system. In the memory cell of the multi-valued memory system, examples of a read operation, a write operation, and an erase operation will be described below.

For example, in a multi-level read operation, threshold voltages are classified into, for example, A level, B level, and C level in the order from the lowest voltage. In this read operation, a voltage which is applied to a word line selected for an A-level read operation is, for example, in a range of 0 V to 0.55 V. The voltage is not limited to this example, and may be, for example, in any range of 0.1 V to 0.24 V, 0.21 V to 0.31 V, 0.31 V to 0.4 V, 0.4 V to 0.5 V, or 0.5 V to 0.55 V. A voltage which is applied to a word line selected for a B-level read operation is, for example, in a range of 1.5 V to 2.3 V. The voltage is not limited to this example, and may be, for example, in any range of 1.65 V to 1.8 V, 1.8 V to 1.95 V, 1.95 V to 2.1 V, or 2.1 V to 2.3 V. A voltage which is applied to a word line selected for a C-level read operation is, for example, in a range of 3.0 V to 4.0V. The voltage is not limited to this example, and may be, for example, in any range of 3.0 V to 3.2 V, 3.2 V to 3.4 V, 3.4 V to 3.5 V, 3.5 V to 3.6 V, or 3.6 V to 4.0 V. The read operation time (tR) may be, for example, in any range of 25 μs to 38 μs, 38 μs to 70 μs, or 70 μs to 80 μs.

The write operation includes a program operation and a verification operation. In the write operation, a voltage which is initially applied to a word line selected during the program operation is, for example, in a range of 13.7 V to 14.3 V. The voltage is not limited to this example, and may be, for example, in any range of 13.7 V to 14.0 V or 14.0 V to 14.6 V. A voltage, which is initially applied to a word line when an odd-numbered word line is written, and a voltage, which is initially applied to a word line when an even-numbered word line is written, may be different from each other. When the program operation is executed using ISPP (Incremental Step Pulse Program), a step-up voltage is, for example, 0.5 V. A voltage which is applied to a non-selected word line may be, for example, in a range of 6.0 V to 7.3 V. The voltage is not limited to this example, and may be, for example, in any range of 7.3 V to 8.4 V, or may be 6.0 V or lower. A pulse voltage to be applied may vary depending on whether a non-selected word line is an odd-numbered word line or an even-numbered word line. The write operation time (tProg) may be, for example, in any range of 1,700 μs to 1,800 μs, 1,800 μs to 1,900 μs, or 1,900 μs to 2,000 μs.

In the erase operation, a voltage initially applied to a well, which is disposed above a semiconductor substrate and above which a memory cell is disposed, is, for example, in a range of 12 V to 13.6 V. The voltage is not limited to this example, and may be, for example, in any range of 13.6 V to 14.8 V, 14.8 V to 19.0 V, 19.0 V to 19.8 V, or 19.8 V to 21 V. The erase operation time (tErase) may be, for example, in any range of 3,000 μs to 4,000 μs, 4,000 μs to 5,000 μs, or 4,000 μs to 9,000 μs.

In addition, the memory cell may have, for example, the following structure. The memory cell includes a charge accumulation film that is disposed on a semiconductor substrate such as a silicon substrate through a tunnel insulating film having a thickness of 4 nm to 10 nm. This charge accumulation film may have a stacked structure in which an insulating film having a thickness of 2 nm to 3 nm such as a silicon nitride (SiN) film or a silicon oxynitride (SiON) film and a polysilicon (Poly-Si) film having a thickness of 3 nm to 8 nm are laminated. Metal such as ruthenium (Ru) may be added to the polysilicon film. The memory cell includes an insulating film on the charge accumulation film. This insulating film includes, for example, a silicon oxide (SiO) film having a thickness of 4 nm to 10 nm which is interposed between a lower High-k film having a thickness of 3 nm to 10 nm and an upper High-k film having a thickness of 3 nm to 10 nm. Examples of the material of the High-k film include hafnium oxide (HfO). In addition, the thickness of the silicon oxide film may be made to be thicker than the thickness of the High-k film. A control electrode having a thickness of 30 nm to 70 nm is provided on the insulating film through a film having a thickness of 3 nm to 10 nm for adjusting a work function. Here, examples of the film for adjusting a work function include a metal oxide film such as a tantalum oxide (Tao) film; and a metal nitride film such as a tantalum nitride (TaN) film. The control electrode may be formed of, for example, tungsten (W). An air gap may be disposed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first portion including a semiconductor element; and
a second portion surrounding the semiconductor element,
wherein the second portion includes:
a stack of conductive layers and insulating layers, and
at least one groove through the conductive layers and the insulating layers, the at least one groove including a first groove having a single hollow portion, wherein the single hollow portion extends in a stacking direction of the stack of conductive layers and insulating layers and extends through multiple layers of the stack.

2. The device according to claim 1,
wherein the at least one groove extends in a stacking direction of the stack of conductive layers and insulating layers.

3. The device according to claim 2,
wherein the at least one groove includes the first groove extending through the conductive layers and the insulating layers and a second groove that is farther from the semiconductor element than the first groove, extending through the conductive layers and the insulating layers.

4. The device according to claim 1,
wherein the single hollow portion is partially filled with insulating material.

5. The device according to claim 1,
wherein the semiconductor element includes a memory cell array.

6. The device according to claim 5,
wherein the semiconductor element further includes a peripheral circuit for the memory cell array.

7. The device according to claim 1,
the second portion further includes a metal layer and a metal pillar.

8. The device according to claim 7, wherein
the stack and the at least one groove are farther from the semiconductor element than the metal layer and the metal pillar.

9. The device according to claim 1, wherein
the second portion further includes metal layers stacked directly above and directly below the stack, and metal pillars that extend through the metal layers.

10. A semiconductor memory device comprising:
a first portion including a semiconductor element; and
a second portion partially surrounding the semiconductor element,
wherein the second portion includes:
a stack of conductive layers and insulating layers, and
at least one groove through the conductive layers and the insulating layers, the at least one groove including a first groove having a single hollow portion, wherein the single hollow portion extends in a stacking direction of the stack of conductive layers and insulating layers and extends through multiple layers of the stack.

11. The device according to claim 10,
wherein the semiconductor element includes a memory cell array and a peripheral circuit for the memory cell array, and the second portion surrounds the semiconductor element alongside the memory cell array but not alongside a substantial portion of the peripheral portion.

12. The device according to claim 10,
wherein the semiconductor element has a rectangular shape, and the second portion surrounds the semiconductor element alongside corners of the semiconductor element but not alongside a substantial portion of each side of the semiconductor element.

13. The device according to claim 10,
wherein the at least one groove extends in a stacking direction of the stack of conductive layers and insulating layers.

14. The device according to claim 10,
the second portion further includes a metal layer and a metal pillar, and the stack and the at least one groove are farther from the semiconductor element than the metal layer and the metal pillar.

15. The device according to claim 10, wherein the second portion further includes metal layers stacked directly above and directly below the stack, and metal pillars that extend through the metal layers.

16. A semiconductor memory device comprising:
a first portion including a semiconductor element; and
a second portion surrounding the semiconductor element, wherein the second portion includes:
a stack of conductive layers and insulating layers,
at least one groove that is formed through multiple layers of the stack and to extend in a stacking direction of the stack such that a sidewall of the at least one groove is in direct contact with the conductive and insulating layers of the stack, and
an insulating film that covers the sidewall of the groove so as to separate a hollow portion of the groove and the conductive and insulating layers of the stack.

17. The device according to claim 16, wherein the hollow portion of the groove extends from an upper portion of the stack to a lower portion of the stack to span multiple conductive and insulating layers of the stack.

* * * * *